United States Patent
Ivanov et al.

(10) Patent No.: US 9,871,489 B2
(45) Date of Patent: Jan. 16, 2018

(54) ARRANGEMENT AND METHOD FOR RADIO-FREQUENCY (RF) HIGH POWER GENERATION FOR COMPENSATING A FAILED POWER AMPLIFIER MODULE

(71) Applicant: OOO Siemens, Moscow (RU)

(72) Inventors: Evgeny Ivanov, Moscow (RU);
Andrey Krasnov, Moscow (RU);
Alexander Smirnov, Moscow (RU);
Marcus Zerb, Hohenbrunn (DE)

(73) Assignees: Siemens Aktiengesellschaft, Munich (DE); OOO SIEMENS, Moscow (RU)

( * ) Notice: Subject to any disclaimer, the term of this patent is extended or adjusted under 35 U.S.C. 154(b) by 0 days.

(21) Appl. No.: 15/111,573

(22) PCT Filed: Jan. 24, 2014

(86) PCT No.: PCT/RU2014/000062
§ 371 (c)(1),
(2) Date: Jul. 14, 2016

(87) PCT Pub. No.: WO2015/112047
PCT Pub. Date: Jul. 30, 2015

(65) Prior Publication Data
US 2016/0336904 A1 Nov. 17, 2016

(51) Int. Cl.
*H03F 1/26* (2006.01)
*H03F 1/52* (2006.01)
(Continued)

(52) U.S. Cl.
CPC ............. *H03F 1/26* (2013.01); *H03F 1/0277* (2013.01); *H03F 1/526* (2013.01); *H03F 3/19* (2013.01);
(Continued)

(58) Field of Classification Search
CPC ................... H03F 1/0288; H03F 1/07
(Continued)

(56) References Cited

U.S. PATENT DOCUMENTS

| 4,780,685 A | 10/1988 | Ferguson |
| 5,541,554 A | 7/1996 | Stengel et al. |

(Continued)

FOREIGN PATENT DOCUMENTS

| JP | S59 172816 | 9/1984 |
| JP | 63-260307 | 10/1988 |

(Continued)

OTHER PUBLICATIONS

Office Action dated Mar. 22, 2017 which issued in the corresponding Korean Patent Application No. 10-2016-7023046.
(Continued)

*Primary Examiner* — Henry Choe
(74) *Attorney, Agent, or Firm* — Cozen O'Connor

(57) ABSTRACT

An arrangement and method for radio-frequency (RF) high power generation which compensate for a failed power amplifier module includes at least one power combiner having RF inputs and at least one RF output, and at least two power amplifier modules electrically connected to a respective input by at least one transmission line, and at least one RF switch formed by the at least one transmission line with a complex load electrically connected to the at least one RF switch.

13 Claims, 4 Drawing Sheets

(51) Int. Cl.
- *H03F 3/60* (2006.01)
- *H03F 1/02* (2006.01)
- *H03F 3/21* (2006.01)
- *H03F 3/24* (2006.01)
- *H03F 3/72* (2006.01)
- *H03F 3/19* (2006.01)

(52) U.S. Cl.
CPC ............. *H03F 3/21* (2013.01); *H03F 3/211* (2013.01); *H03F 3/24* (2013.01); *H03F 3/602* (2013.01); *H03F 3/72* (2013.01); *H03F 2200/312* (2013.01); *H03F 2200/321* (2013.01); *H03F 2200/414* (2013.01); *H03F 2200/417* (2013.01); *H03F 2200/451* (2013.01); *H03F 2203/7221* (2013.01); *H03F 2203/7236* (2013.01)

(58) Field of Classification Search
USPC .............................................. 330/295, 124 R
See application file for complete search history.

(56) References Cited

U.S. PATENT DOCUMENTS

| | | | |
|---|---|---|---|
| 5,767,755 A | 6/1998 | Kim et al. | |
| 5,884,143 A * | 3/1999 | Wolkstein | H03F 1/526 330/107 |
| 6,812,786 B2 * | 11/2004 | Jackson | H03F 1/52 330/124 D |
| 7,486,136 B2 * | 2/2009 | Bakalski | H03F 1/0277 330/124 R |
| 2002/0097087 A1 | 7/2002 | Petz et al. | |
| 2005/0225385 A1 | 10/2005 | Merrill | |
| 2008/0074735 A1 | 3/2008 | Bakalski et al. | |
| 2012/0126886 A1 | 5/2012 | Hellberg | |
| 2013/0135052 A1 * | 5/2013 | Arkiszewski | H03F 3/19 330/295 |
| 2014/0118072 A1 * | 5/2014 | Briffa | H03F 1/025 330/295 |
| 2015/0155838 A1 * | 6/2015 | Embar | H03F 1/56 330/295 |

FOREIGN PATENT DOCUMENTS

| | | |
|---|---|---|
| JP | 2004-363868 | 12/2004 |
| JP | 2010-041588 | 2/2010 |
| JP | 2011-188269 | 9/2011 |
| JP | 2012-205212 | 10/2012 |
| RU | 2177205 | 12/2001 |
| WO | WO 2011/034511 | 3/2011 |

OTHER PUBLICATIONS

Search Report dated Sep. 14, 2017 which issued in the corresponding European Patent Application No. 14753168.5.
Office Action dated Sep. 28, 2017 which issued in the corresponding Korean Patent Application No. 10-2016-7023046.
Office Action dated Oct. 2, 2017 which issued in the corresponding Japanese Patent Application No. 2016-548020.

* cited by examiner (State of the Art)

(State of the Art)

ARRANGEMENT AND METHOD FOR RADIO-FREQUENCY (RF) HIGH POWER GENERATION FOR COMPENSATING A FAILED POWER AMPLIFIER MODULE

CROSS-REFERENCE TO RELATED APPLICATIONS

This is a U.S. national stage of application No. PCT/RU2014/000062 filed 24 Jan. 2014.

BACKGROUND OF THE INVENTION

1. Field of the Invention

The present invention relates to an arrangement and method for Radio-Frequency (RF) high power generation comprising at least one power combiner having RF inputs and at least one RF output, and at least two power amplifier modules electrically connected to respectively an input by at least one transmission line, where at least one RF switch is formed by the at least one transmission line.

2. Description of the Related Art

Radio-Frequency (RF) and/or microwave power is produced with appropriate generators. RF power generators for high power applications are based on tubes, such as klystrons, inductive output tubes or magnetrons. Alternatively, solid state technology is used for RF power generators, particularly transistor technology. With solid state RF power generators, a reliable RF power production with small dimensions and high efficiency is possible. One disadvantage of transistor technology is a low RF power output per transistor chip, in the range of up to 1.5 kW power output at 500 MHz frequency. For comparison, with klystrons as an example for tube technology, up to a Megawatt level of RF power output is possible.

To generate high amounts of power with, for example, transistor based RF generators, an aggregation of RF generators is necessary. An aggregation of transistors in a single power amplifier PA based, for example, on push-pull or a balanced kind of topology, can increase the complexity of the system and increases the risk of failure. If single transistors fail, the entire device must be exchanged. An alternative way is to use a number of power amplifier modules with a common, particularly single power combiner. In a modular arrangement, RF power from the power amplifier modules, connected via transmission lines to the common power combiner, is aggregated in the power combiner to a high RF power level. For example, coaxial cables and/or strip-lines are used as transmission lines. The output power of power amplifier modules provided to the power combiner is adjusted and optimized to provide a high efficiency. A low reflection of power from inputs of the power combiner to the respective power amplifier module and low power transmission from a power amplifier module to other power amplifier modules, the "cross-talking" is ensured.

In case one or more power amplifier modules fails to operate, such as due to desired shutdown for stepped output RF power adjustment and/or due to defects/failure of power amplifier modules, such as due to overheating or transistor failure, the module does or modules do not generate RF power anymore, and at the respective power combiner input an arbitrary value of output impedance of the module is generated. The system is out of balance and crosstalk as well as mismatching, i.e., increased reflected RF power from the power combiner input, can as a result occur. A significant part of the total output RF power from still proper functioning power amplifier modules can be transferred through the power combiner to defect modules. These reduce the total RF power at an output-load that can be used by RF power consuming devices. The total efficiency of the power combiner system is reduced.

One possible conventional solution is the use of power combiners with a high amount of isolation between input ports, such as Wilkinson type power combiners. In case of failure of one or more power amplifier modules, a built in isolation resistor dissipates a significant amount of power from the remaining power amplifier modules. In this kind of power combiner, the cross-talking is reduced but the total power combining efficiency is also reduced, due to the output power dissipation in the isolation resistor.

Another possible conventional solution is to use circulators individually controlled at each output of an RF power amplifier module. In case of failure of a power amplifier module, reflected and cross-fed power will be dissipated in a dummy load connected to the respective circulator. The resultant total power efficiency of the power combining system is decreased because of a decrease of the available power at a load downstream to the power combiner.

SUMMARY OF THE INVENTION

It is an object of the present invention to provide an easy to use and cost effective arrangement and method for Radio-Frequency (RF) high power generation with a power combiner and with electrically connected power amplifier modules with high total efficiency, particularly in cases in which one or more power amplifier module fails. It is a further object of the present invention to reduce cross-talk and power reflection from inputs of the power combiner even in the event of failure of one or more power amplifier modules.

These and other objects and advantages are achieved in accordance with the invention by an arrangement for Radio-Frequency (RF) high power generation and a method for RF high power generation in which the arrangement for RF high power generation comprises at least one power combiner having RF inputs and at least one RF output, and at least two power amplifier modules electrically connected to a respective input by at least one transmission line. At least one RF switch is formed by the at least one transmission line and a complex load is electrically connected to the at least one RF switch.

The use of at least one RF switch with an electrically connected complex load allows balancing of the arrangement in cases of, for example, failure of at least one power amplifier module. If a module is out of order, for example, defective, a respective RF switch can be switched from a state electrically connecting the module with the power combiner to a state connecting the respective input of the power combiner with the complex load. The complex load at the input provides a certain impedance value at the respective input of the power combiner, tuning the power combiner back to a state with matching between remaining, still functioning power amplifier modules and the output load at the output of the power combiner. No useful power is dissipated and the total power combining efficiency remains constant compared to the state before, for example, the failure of the power amplifier module. The lack of power from, for example, a defect power amplifier module can be reimbursed by increasing the output RF power from properly functioning power amplifier modules.

Components such as switch boxes are compared to the use of circulators cheaper, and they can be smaller in dimension and easier to use. There can be a higher amount of power provided to switches than to circulators or Wilkinson types of power combiners without failure of the overall system. In cases of switching off at least one power amplifier module for stepped output RF power adjustment, the efficiency of the arrangement is not decreased. The same applies in case of the failure of power amplifier modules.

The arrangement in accordance with the present invention is easy to use and cost effective, and preserves a high total efficiency, even for cases in which one or more power amplifier modules fail and/or are switched off for stepped RF power adjustment. Cross-talk and power reflection from inputs of the power combiner are suppressed and respectively reduced, even in the event of failure of one or more power amplifier modules.

The complex load of the arrangement can be a predefined load, particularly in the range of 50 OHM and/or can be connected in a kind of short circuit, i.e., connected to ground, and/or can be connected in a kind of open circuit, i.e., disconnected from ground.

The predefined complex load can be in a range, defined to balance the arrangement after, for example, failure or switching off of the respective power amplifier module. The complex value has to be chosen in a range to match working power amplifier modules electrically connected to the power combiner.

The RF switches can be externally controlled RF switches, particularly a pin-diode and/or mechanical switches. A control unit can be configured to detect a failure of a power amplifier module and/or to control the RF switches. If a failure of a power amplifier module is detected, the respective switch can be switched by the control unit from a position electrically connecting the defect power amplifier module with the respective input of the power combiner to a position electrically connecting the respective input of the power combiner to the respective complex load. In preferred embodiments, the control unit comprises a computer and/or micro-controller unit.

At least one output load can be electrically connected to the at least one RF output of the at least one power combiner, particularly formed by at least one output transmission line. Among others, a consumer such as a medical device, analytical or other high RF power consuming device can be electrically connected.

It is also an object of the invention to provide a method for Radio-Frequency (RF) high power generation, particularly with an arrangement as described above, comprising detecting of failure of at least one power amplifier module out of at least two power amplifier modules electrically connected to a respective input of at least one power combiner, where the at least two power amplifier modules electrically connected to the at least one power combiner respectively by at least one transmission line comprises at least one RF switch, and switching the at least one RF switch of the at least one power amplifier module which has failed to a mode without electrical connection of the at least one power combiner input to the at least one power amplifier module which has failed and with electrical connection of the at least one power combiner input to a complex load.

The power $P_k$ of the failed at least one power amplifier module can be compensated for by remaining working power amplifier modules, resulting in a power P from the RF output of the power combiner to an output load particularly equal to the power P before failure of the at least one power amplifier module. The power combining efficiency can remain the same as before the failure of a power amplifier module. No power is lost due to switching off the defect module and due to connecting the predefined complex load to the respective input of the power combiner, while balancing the arrangement and preventing power loss by reflected power from remaining, working power amplifier modules.

The method can be an automatic method, particularly controlled by a computer and/or micro-controller unit. Alternatively, the method can be a manual method, such as switching by hand after the detection of failure. A combination of manual and automatic method is also possible, such as automatic failure detection and manual switching.

At the input of the at least one power combiner, which is electrically connected to the at least one power amplifier module which has failed before the switching step, a defined impedance can be connected after the switching is performed. This defined impedance reduces or prevents power $P_k^r$ from inputs of the power combiner to be reflected to working power amplifier modules and/or prevents power $P_k^c$ from the failed at least one power amplifier module to be returned to the working power amplifier modules.

Cross-talk and/or mismatching of power in the arrangement with a power combiner with working power amplifier modules and at least one failed power amplifier module can be minimized and/or prevented by switching the at least one RF switch of the failed at least one power amplifier module to a mode without electrical connection of the module to the input of the power combiner and/or by switching the at least one RF switch of the failed at least one power amplifier module to a mode with electrical connection to a particularly predefined complex load.

The advantages in connection with the described method for RF high power generation in accordance with the present invention are similar to the previously, in connection with the arrangement for RF high power generation described advantages and vice versa.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention is further described hereinafter with reference to illustrated embodiments shown in the accompanying drawings, in which.

DETAILED DESCRIPTION OF THE EXEMPLARY EMBODIMENTS

Figure 1:
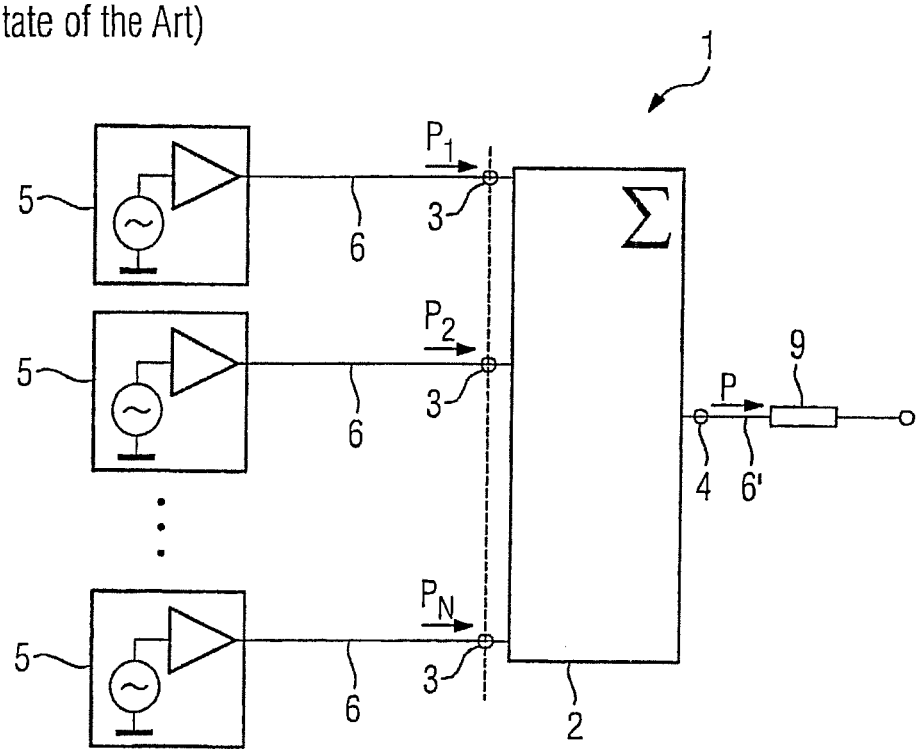
FIG. 1 illustrates an arrangement 1 of a power combiner 2 with N working power amplifier modules 5 in accordance with the state of the art.

FIG. 1 shows an arrangement 1 of a conventional power combiner 2 with N working power amplifier modules 5. The power amplifier modules 5 are connected to a respective input 3 of the power combiner 2 via an input transmission line 6. An output load 9 comprises an output transmission line 6' electrically connected to an RF output 4 of the power combiner 2.

At normal regime, i.e. with all power amplifier modules 5 operating properly and without any defective power amplifier modules, the power combiner 2 is driven at the inputs 3 by all N power amplifier modules 5. The power combiner 2 combines the output power $P_i$, with i=1, 2, 3, ..., N, of all N power amplifier modules 5, providing an RF power $P=P_1+P_2+P_3+ \ldots +P_N$ to the output load 9. The output impedances of all power amplifier modules 5 are tuned to defined values, typically, for example, every power amplifier module 5 is matched to 50 Ohm, thus balancing the arrangement 1. The power reflected from the respective input 3 of the power combiner 2 connected to the power amplifier module 5 should be low, i.e., minimized for all inputs 3, and the power transmission from a power amplifier module 5 to all other power amplifier modules 5, i.e., the "cross-talk", should be low, i.e., minimized. In this condition, the arrangement 1 is denoted as balanced.

Figure 2:
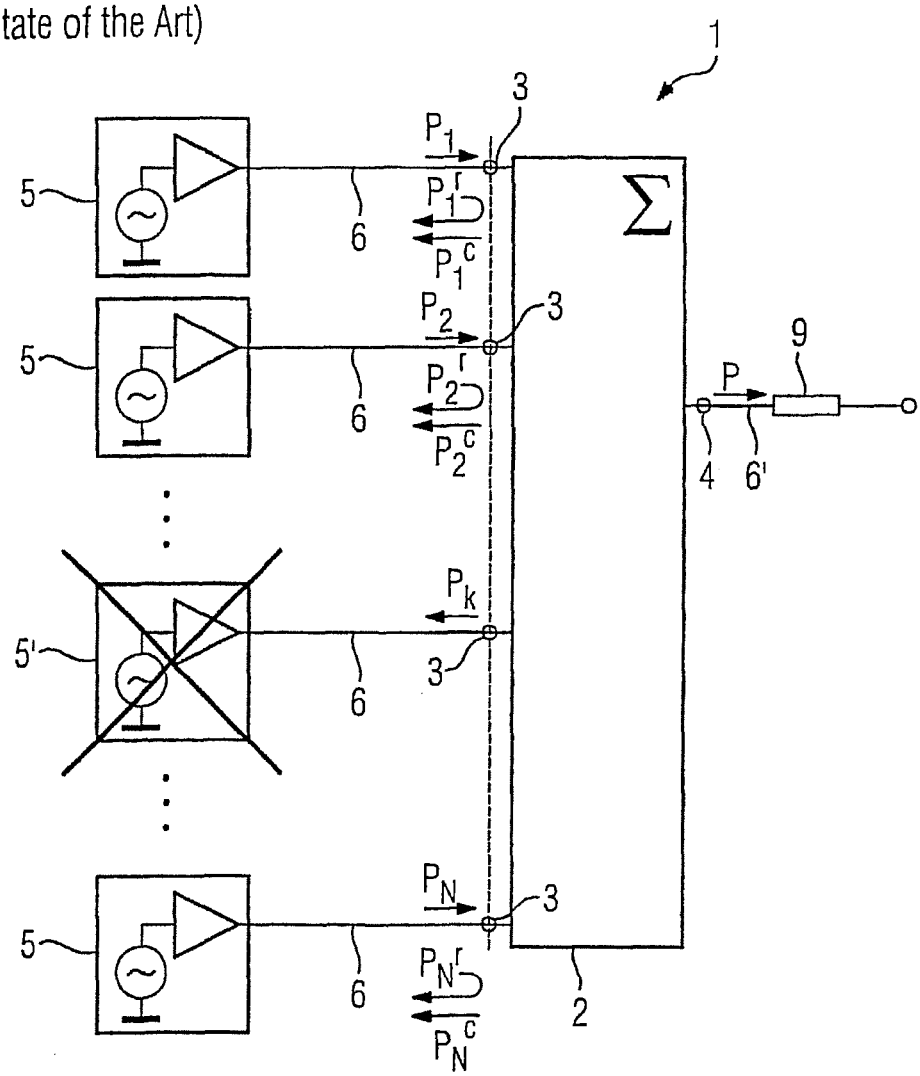
FIG. 2 illustrates an arrangement 1 as shown in FIG. 1 but with a defect power amplifier module 5' in accordance with the state of the art.

FIG. 2 shows a conventional arrangement 1 as shown in FIG. 1 but in a non-balanced state, with a defect or switched off power amplifier module 5'. In case some, or at least one power amplifier module 5' get out of operation, such as due to desired power amplifier module 5' shutdown for stepped output RF power P adjustment or due to defects, overheating, transistor damage in case the power amplifier module 5' is based on transistors, or other errors, the non-operational power amplifier module 5' does not generate RF power $P_k$. The output impedance of the non-operational power amplifier module 5', such as failed power amplifier module 5', is unknown, with an arbitrary complex value applied to the respective input 3 of the power combiner 2.

These result in an increase of RF power reflected from the power combiner inputs, i.e., mismatching, an increase of cross-talk between power amplifier modules 5, and a significant part of total output RF power provided by normal functioning power amplifier modules 5 can be transferred via the power combiner 2 to the defective or switched off power amplifier module 5'. The RF power P to be used by consumers connected to the arrangement 1, not shown in detail in the FIG. for simplicity, which is transferred to the output load 9 is reduced. The total efficiency of the arrangement 1 is decreased in comparison to the situation described with respect to FIG. 1.

In the embodiment shown in FIG. 2, the situation is illustrated for one defect power amplifier module 5' with number k. It should be understood this is merely exemplary, and there can be more than one defective power amplifier module 5', or it/they can be switched off for stepped adjustment of output power P of the power combiner 2. The number of power amplifier modules 5 is N. The RF power $P_i^r$ with i=1, 2, 3, ..., N and i≠k is the respective reflected RF power from the respective input 3 of the power combiner 2. The power $P_i^c$ with i=1, 2, 3, ..., N and i≠k is additionally returned RF power coming from the power combiner 2 towards operating power amplifier modules 5 as a result of cross-talk. $P_k$ is the RF power transferred via the power combiner 2 from operating power amplifier modules 5 to the defect or switched off power amplifier module 5'.

The RF power transferred to an output load 9 from the power amplifier modules 5 is $$P=(P_1+P_2+P_3+ \ldots +P_{k-1}+P_{k+1}+ \ldots +P_N)-(P_1^r+P_1^c+P_2^r+P_2^c+P_3^r+P_3^c+ \ldots +P_N^r+P_N^c+P_k),$$

which can be reduced down to zero depending on the value of the unknown output impedance of the defective or switched off power amplifier module 5'. Reflected and cross-fed power can cause damage of properly operating power amplifier modules 5 and/or damage or further damage the switched off or damaged power amplifier module 5'.

To prevent damage and to preserve the total power combining efficiency, an object of the present invention is to reduce the values of $P_i^r$, $P_i^c$ and $P_k$ particularly to a minimum in order to save and extend operation of the arrangement 1.

Figure 3:
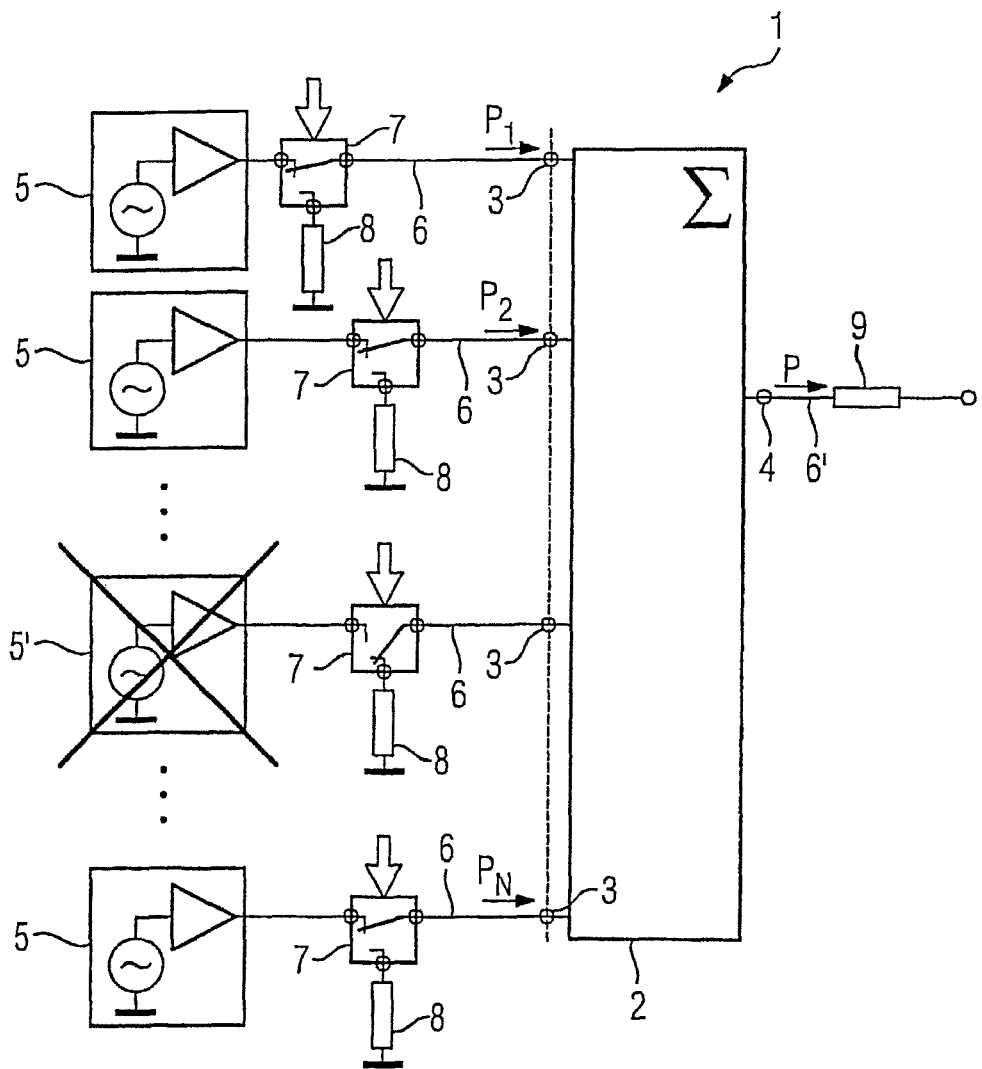
FIG. 3 illustrates an arrangement 1 in accordance with the present invention having RF switches 7 connected to a respective complex load 8, arranged between power amplifier modules 5 and the power combiner 2 to balance the arrangement 1 after switch off and/or failure of at least one power amplifier module 5.

FIG. 3 shows an arrangement 1 in accordance with the present invention, with RF switches 7 connected to a respective complex load 8, so as to balance the arrangement 1 after switch off and/or failure of at least one power amplifier module 5'. By switching the RF switch 7 from a position of electrically connecting the defective or switched off power amplifier module 5' via an input transmission line 6 to the respective input 3 of the power combiner 2 to a position where a predefined complex load 8 is electrically connected to the respective input 3 of the power combiner 2, the values of $P_i^r$, $P_i^c$ and $P_k$ are reduced, particularly to a minimum.

The arrangement 1 shown in FIG. 3 is similar to the arrangement of FIG. 2, but further includes an RF switch 7 connected to a respective complex load 8 additionally comprised by each input transmission lines 6. As long as all power amplifier modules 5 are in operation, particularly without failure, as it is also the situation in FIG. 1, all switches are in a position at which the respective power amplifier module 5 are electrically connected via an input transmission line 6 to the respective input 3 of the power combiner 2, where the situation is not shown in FIG. 3 merely for purposes of simplicity. If one or more than one power amplifier modules 5' are defective or have to be switched off for other reasons, the switch 7' of the respective power amplifier module 5' is switched into a position of in which a predefined complex load 8 is electrically connected to the respective input 3 of the power combiner 2 and the respective power amplifier module 5' is electrically disconnected from the power combiner 2. As a result, a defined impedance value at the input 3 of the power combiner 2 turns the arrangement 1 into a matching mode, where the predefined complex load 8 with defined impedance value results in a matching of remaining, operating power amplifier modules 5 electrically connected to the power combiner 2 and in balance with the output load 9. The values of $P_i^r$, $P_i^c$ and $P_k$ are reduced, particularly to a minimum and/or zero if the correct value of the complex load 8 was chosen. A typical value of a complex load 8 is in the range of 50 Ohm.

After switching, the resultant total power at the output load 9 is $$P=(P_1+P_2+P_3+ \ldots P_{k-1}+P_{k+1}+ \ldots +P_N).$$

No power, which is used in a mode without a defective or switched off power amplifier module, is dissipated and the total power combining efficiency remains constant and is respectively is preserved. The missing RF power, which was provided before failure or switching off by the power amplifier module 5', can be recaptured by increasing the output RF power of the remaining, properly operating and still to the power combiner 2 electrically connected power amplifiers 5.

The RF switch is, for example, built of or comprises a pin diode or a relay. A control unit, not shown in FIG. 3 for simplicity but denoted by an arrow at the respective switch 8, can be configured to detect a failure of a power amplifier module 5'. The control unit can control the RF switches 7 and trigger the switching. A control unit can be or comprise, for example, a computer and/or a micro-controller unit. Alternatively, the control unit can detect the failure, but the switched is accordingly switched manually. A further alternative is that the detection of failure and switching is performed manually.

Switches comprising a pin diode or a relay, such as a switch box, are cheaper in comparison, for example, to circulators. A switch box can be smaller in size than circulators, resulting in a compact arrangement 1 in accordance with the present invention. The power provided by the arrangement 1 in accordance with the present invention can be higher, compared to arrangements comprising circulators instead of switch boxes or compared to arrangements of Wilkinson power combiners. The arrangement 1 in accordance with the present invention can be used to switch off RF power amplifier modules 5', for example, for stepped output RF power adjustment, without losing power combining efficiency.

The above described features of embodiments in accordance with the present invention can be combined with each other and/or can be combined with embodiments known from the state of the art. For example more than one power amplifier module 5' can be switched off and/or can be defect. The arrangement 1 can comprise more than one power combiner 2. Among others the output load 9 can be a medical device or other electrical acceptors particularly consumers, using the high RF power provided by the arrangement 1.

Figure 4:
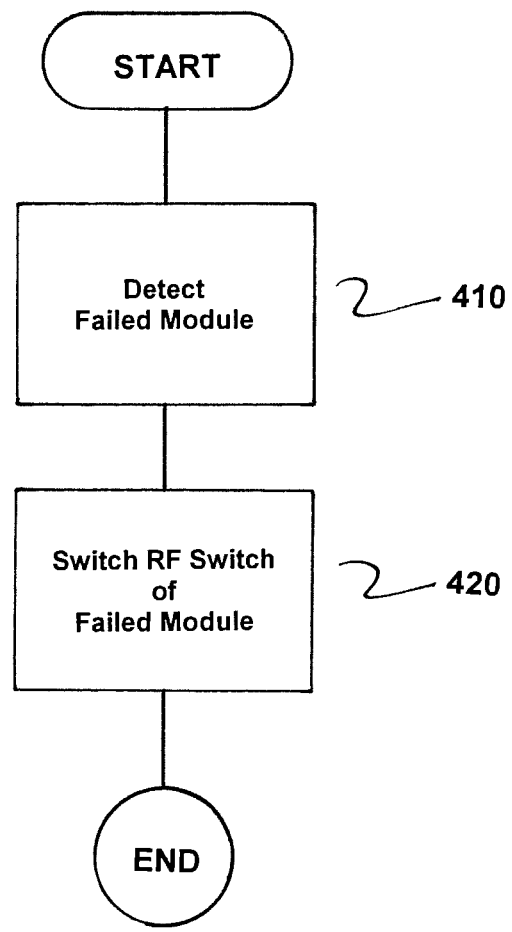
FIG. 4 is a flowchart of the method in accordance with the invention.

FIG. 4 is a flowchart of a method for radio frequency (RF) high power generation. The method comprises detecting failure of at least one power amplifier module (5') of at least two power amplifier modules (5, 5') electrically connected to a respective input (3, 3') of at least one power combiner (2), as indicated in step 410. In accordance with the method of the invention, the at least two power amplifier modules (5, 5') are respectively and electrically connected to the at least one power combiner (2) by at least one transmission line (6) comprising at least one RF switch (7, 7').

Next, the at least one RF switch (7') of the at least one power amplifier module (5') which has failed is switched to a mode without electrical connection of the at least one power combiner (2) input (3 to the at least one power amplifier module (5) which has failed and with electrical connection of the at least one power combiner (2) input (3') to a complex load (8), as indicated in step 420.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An arrangement for radio-frequency (RF) high power generation, comprising:
at least one power combiner having RF inputs and at least one RF output;
at least two power amplifier modules electrically connected to a respective input by at least one transmission line comprising at least one externally controlled RF switch;
a complex load electrically connected to the at least one externally controlled RF switch at a respective output of the at least two power amplifier modules; and
a control unit configured to at least one of (i) detect a failure of a power amplifier module and (ii) control the at least one externally controlled RF switch.

2. The arrangement according to claim 1, wherein the complex load comprises a predefined load.

3. The arrangement according to claim 2, wherein the predefined load is at least one of in a range of 50 Ohms, connected as a short circuit and connected as an open circuit.

4. The arrangement according to claim 3, wherein the at least one externally controlled RF switch comprises one of a pin-diode and mechanical switch.

5. The arrangement according to claim 1, wherein the at least one externally controlled RF switch comprises one of a pin-diode and mechanical switch.

6. The arrangement according to claim 1, wherein the control unit comprises at least one of a computer and a microcontroller unit.

7. The arrangement according to claim 1, further comprising:
at least one output load electrically connected to the at least one RF output of the at least one power combiner comprising the at least one output transmission line.

8. A method for radio-frequency (RF) high power generation, the method comprising:
detecting failure of at least one power amplifier module of at least two power amplifier modules electrically connected to a respective input of at least one power combiner, the at least two power amplifier modules being respectively and electrically connected to the at least one power combiner by at least one transmission line comprising at least one RF switch; and
switching the at least one RF switch of the at least one power amplifier module which has failed to a mode without electrical connection of the at least one power combiner input to the at least one power amplifier module which has failed and with electrical connection of the at least one power combiner input to a complex load electrically connected to the at least one externally controlled RF switch at a respective output of the at least two power amplifier modules.

9. The method according to claim 8, wherein a power of the at least one power amplifier module which has failed is compensated for by remaining working power amplifier modules, resulting in a power from an RF output of the power combiner to an output load being equal to a power before failure of the at least one power amplifier module.

10. The method according to claim 8, wherein the method is automatically controlled via at least one of a computer, a micro-controller unit and a manual method.

11. The method according to claim 9, wherein the method is automatically controlled via at least one of a computer, a micro-controller unit and a manual method.

12. The method according to claim 8, wherein at an input of the at least one power combiner, before said switching to a mode without electrical connection to the at least one power amplifier module which has failed, after said switching a defined impedance connected to the input at least one of (i) reduces or prevents power from inputs of the at least one power combiner to be reflected to working power amplifier modules and (ii) prevents power from the at least one power amplifier module which has failed to be returned to the working power amplifier modules.

13. The method according to claim 8, wherein cross-talking and mismatching of power in the arrangement with a power combiner with working power amplifier modules and at least one power amplifier module which has failed is minimized and prevented by at least one of (i) switching the at least one RF switch of the at least one power amplifier module which has failed to a mode without electrical connection of the module to the input of the at least one power combiner and (ii) switching the at least one RF switch of the at least one power amplifier module with failure to a mode with electrical connection to a predefined complex load.

* * * * *